(12) United States Patent
Molaro et al.

(10) Patent No.: US 9,046,907 B2
(45) Date of Patent: Jun. 2, 2015

(54) FULL-BRIDGE CONVERTER WITH DIGITAL PULSE MODULATION (DPWM) FOR DRIVING A LOAD

(75) Inventors: Denis Molaro, Campoformido (IT); Enrico Braidotti, Monfalcone (IT)

(73) Assignee: Elettra - Sincrotrone Trieste S.C.P.A., Basovizza-trieste (IT)

( * ) Notice: Subject to any disclaimer, the term of this patent is extended or adjusted under 35 U.S.C. 154(b) by 211 days.

(21) Appl. No.: 13/988,698

(22) PCT Filed: Nov. 23, 2011

(86) PCT No.: PCT/EP2011/070757
§ 371 (c)(1),
(2), (4) Date: May 21, 2013

(87) PCT Pub. No.: WO2012/069512
PCT Pub. Date: May 31, 2012

(65) Prior Publication Data
US 2013/0241514 A1    Sep. 19, 2013

(30) Foreign Application Priority Data
Nov. 23, 2010   (IT) ............... PD2010A0352

(51) Int. Cl.
G05F 1/46 (2006.01)
H02M 7/5387 (2007.01)
H03K 7/08 (2006.01)

(52) U.S. Cl.
CPC ............. *G05F 1/46* (2013.01); *H02M 7/53873* (2013.01); *H03K 7/08* (2013.01)

(58) Field of Classification Search
USPC ........... 327/423, 588, 108–112, 175; 363/132
See application file for complete search history.

(56) References Cited

U.S. PATENT DOCUMENTS

| | | | | |
|---|---|---|---|---|
| 5,285,372 | A * | 2/1994 | Huynh et al. ................. | 363/132 |
| 7,308,027 | B1 * | 12/2007 | Gaboriau et al. ............. | 375/238 |
| 2005/0146366 | A1 | 7/2005 | Steinschaden | |
| 2008/0137385 | A1 * | 6/2008 | Kang ........................... | 363/132 |
| 2013/0241514 | A1 * | 9/2013 | Molaro et al. ................ | 323/283 |

FOREIGN PATENT DOCUMENTS

EP    1014552    6/2000

OTHER PUBLICATIONS

Yan-Fei Liu and P.C. Sen, "Digital Control of Switching Power Converters", 2005 IEEE Conference on Control Applications, Aug. 28-31, 2005, Toronto, Canada, pp. 635-640.

* cited by examiner

*Primary Examiner* — Timothy J Dole
*Assistant Examiner* — Bryan R Perez
(74) *Attorney, Agent, or Firm* — Stetina Brunda Garred & Brucker (57) ABSTRACT

A method is described for driving a full-bridge circuit (34,64) comprising a circuit (31) generating a first output modulation signal (m1) and a second output modulation signal (m2) for controlling the full-bridge. The method comprises the steps for generating a first (X1) and a second (X2) square waveform having a common period (Ts), where the first waveform (X1) is configured in order to drive a leg of the full-bridge and the second waveform is configured in order to drive the other leg of the full-bridge. The method is characterized in that the first square waveform (X1) is generated with a first duty cycle based on a first modulation signal (m1); the second square waveform (X2) is generated with a second duty cycle greater than or equal to the first duty cycle of a time increment Ts/(N−1) based on the second modulation signal (m2).

14 Claims, 8 Drawing Sheets

FULL-BRIDGE CONVERTER WITH DIGITAL PULSE MODULATION (DPWM) FOR DRIVING A LOAD

TECHNICAL FIELD OF THE INVENTION

The present invention relates to equipment and a method for power converters of the switching type and direct-current motors for a wide range of applications that include robotics, portable electronics, sports equipment, electrical household appliances, medical devices, automotive applications, instruments for light machines such as synchrotrons.

DESCRIPTION OF THE PRIOR ART

Pulse-width modulation (PWM) is a very widely used technique for driving loads of various electrical systems and for various values of output power. Electrical loads that require four-quadrant driving (i.e. output voltage and current can assume any value represented in the voltage-current plane) are often driven by the full-bridge (or H bridge) configuration. Interest in digital control of converters of the switching type has increased considerably in recent years. The digital approach, compared with the analogue approach, offers various advantages, such as immunity to the variations of the components used in the circuit during the period of use.

Figure 1:
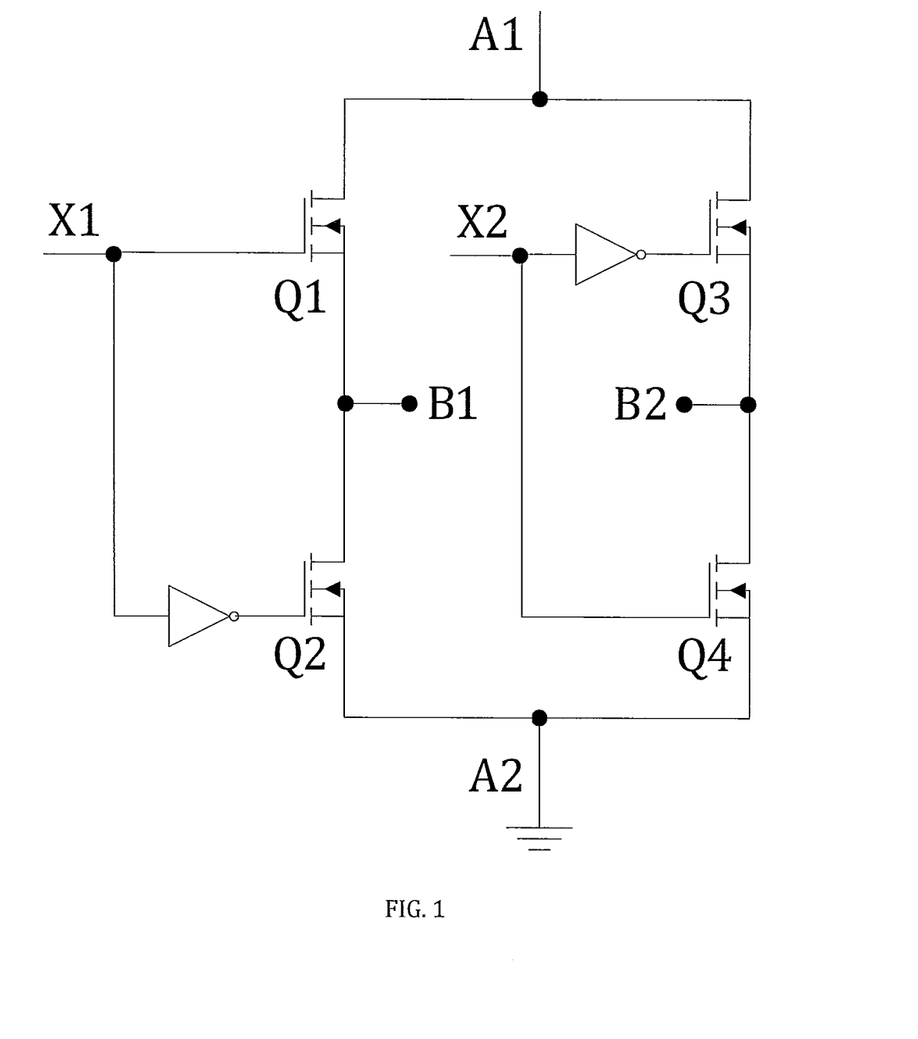
FIG. 1 is a simplified schematic of a standard full-bridge stage that uses transistors of the MOSFET type.

The diagram of this circuit is shown in FIG. 1.

This circuit includes two input signals A1 and A2, two output terminals B1 and B2 and two control signals X1 and X2. The switching elements Q1, Q2, Q3, and Q4 are normally semiconductor devices, for example transistors of the BJT, MOSFET or IGBT type. The bridge consists of two different legs, identifiable with the conduction paths of the transistors, i.e. of the collector-emitter or drain-source currents. The control pins Q1 and Q4 are directly connected to the respective control signals X1 and X2. The control terminal of Q3 is connected to terminal X2 via an inverting port, whereas the terminal of Q2 is connected to X1 via another inverting port. The load is connected between the output terminals B1 and B2 while the inputs A1 and A2 are normally connected respectively to a positive potential and to a reference earth. The input signals at X1 and X2 define the voltage levels of B1 and B2: when the voltage on X1 is high, Q1 is on and Q2 is off (i.e. A1 and B1 ideally assume the same potential) and when X1 is at a low voltage, Q1 is off and Q2 is on (i.e. A2 and B1 at the same potential). This situation is reproducible on the other leg of the bridge.

Figure 2:
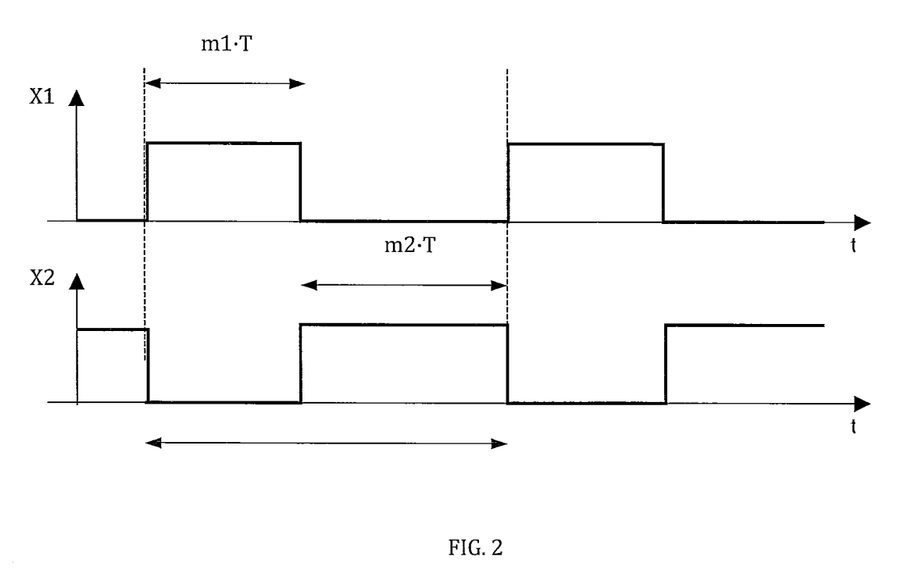
FIG. 2 illustrates some typical waveforms used for driving a full-bridge circuit.

The commonest way of driving a full-bridge is that shown in FIG. 2, where X1 and X2 are the control signals.

The average output current that flows through the load connected between terminals B1 and B2 can be regulated in amplitude and direction by changing the portion of time that X1, and consequently X2, remain at a high voltage level during a period T of the switching frequency. A basic technique for full-bridges implies that X1 should remain high for $m1 \cdot T$ while X2, which is the inverted version of X1, should remain high for $m2 \cdot T = (1-m1) \cdot T$. With this technique, the control signals X1 and X2 are directly correlated with a single coefficient of modulation (or in the jargon duty cycle) $m = m1 = 1 - m2$.

The use of circuits with digital pulse-width modulation (DPWM) introduces discretization of the possible values of the coefficients of modulation m1 and m2; this leads to a consequent discretization of the average output voltage/current values attainable. This pulse-width modulation, making use of an n-bit quantizer, leads to a situation where the voltage/current can reach, in steady-state conditions, $N=2^n$ different values, where n is the resolution, i.e. the number of bits used for quantizing each value.

SUMMARY OF THE INVENTION

An object of the present invention is the provision of a circuit with digital pulse-width modulation that increases the resolution of the actuator in the full-bridge configuration.

The basic idea of the present invention is to provide a method for driving the two legs of the full-bridge as two independent half-bridge stages with a given sequence of digital amplitude pulses such that the control signals are not directly correlated with a single coefficient of modulation, as in the prior art, and such as to increase the average voltage/current resolution.

The method and the circuit for driving a load with a full-bridge in combination with a standard n-bit DPWM circuit results in an output resolution equivalent to $n+\log_2 (2+\frac{1}{2}^n)$, increasing it by a little more than one bit. The circuit, combined with the DPWM and included in the negative feedback loop of a power supply of the switching type, makes it possible to relax the conditions that lead to establishment of limit cycles because of scant resolution and improves the capacity for control. The full-bridge switching supply includes an input, an output and two control inputs.

This and other objects are achieved by means of the equipment and method as described in the appended claims, and are regarded as an integral part of the present description.

BRIEF DESCRIPTION OF THE DRAWINGS

The invention will become entirely clear from the following detailed description, given purely as an illustrative, non-limiting example, to be read with reference to the appended drawings, where.

The same number and letter references in the figures designate the same or functionally equivalent parts.

DESCRIPTION OF AN EXAMPLE

Figure 3:
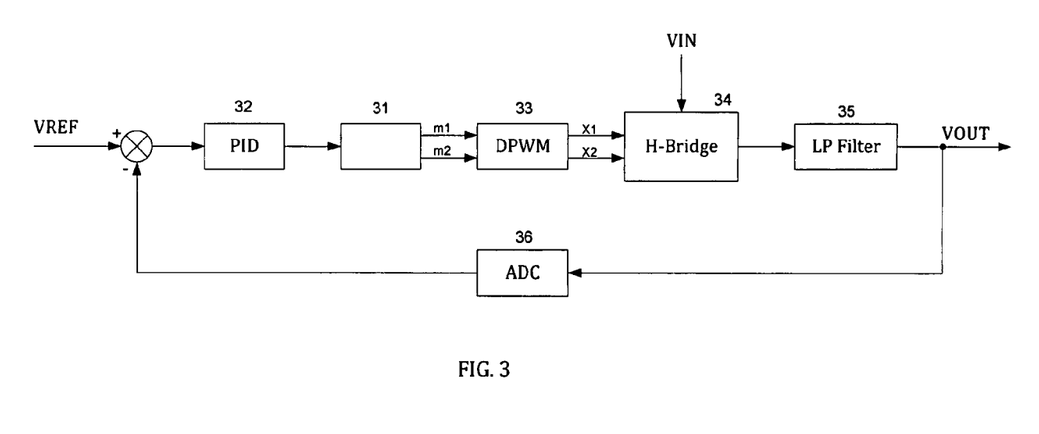
FIG. 3 is a block diagram of a power supply of the switching type containing the circuit according to the present invention.

FIG. 3 shows a diagram of a power supply of the switching type that includes circuit 31, which is the particular object of the invention. When a full-bridge stage is modulated by a sequence of pulses containing $N=2^n$ amplitude pulses, after an ideal low-pass (LP) filter, the number of discrete output values amounts to N. The resolution of the output voltage corresponds to the interval between the voltage levels.

The circuit 31, according to the present invention, is placed between the output of the proportional-integrative-derivative (PID) block 32 and the input of the digital pulse-width modulation (DPWM) circuit 33. The input signal of the digital control block PID 32 represents the error between the value of the reference voltage ("set" point) VREF and the output value of the analogue-digital converter (ADC) 36; the output signal represents the coefficient of modulation m.

The coefficient of modulation m is applied as digital input to block 31, which generates two different digital outputs, defined as m1 and m2. These two coefficients of modulation are then converted into two different square waves X1 and X2 by the DPWM block 33. These square waves, X1 and X2, drive a full-bridge switching stage 34 of the type of the circuit of FIG. 1, which also includes an input voltage VIN, followed by a low-pass output filter 35 to obtain the output voltage VOUT, which is detected by an analogue/digital converter (ADC). Blocks 32, 33, 34, 35 and 36 are substantially of a known structure.

Figure 4:
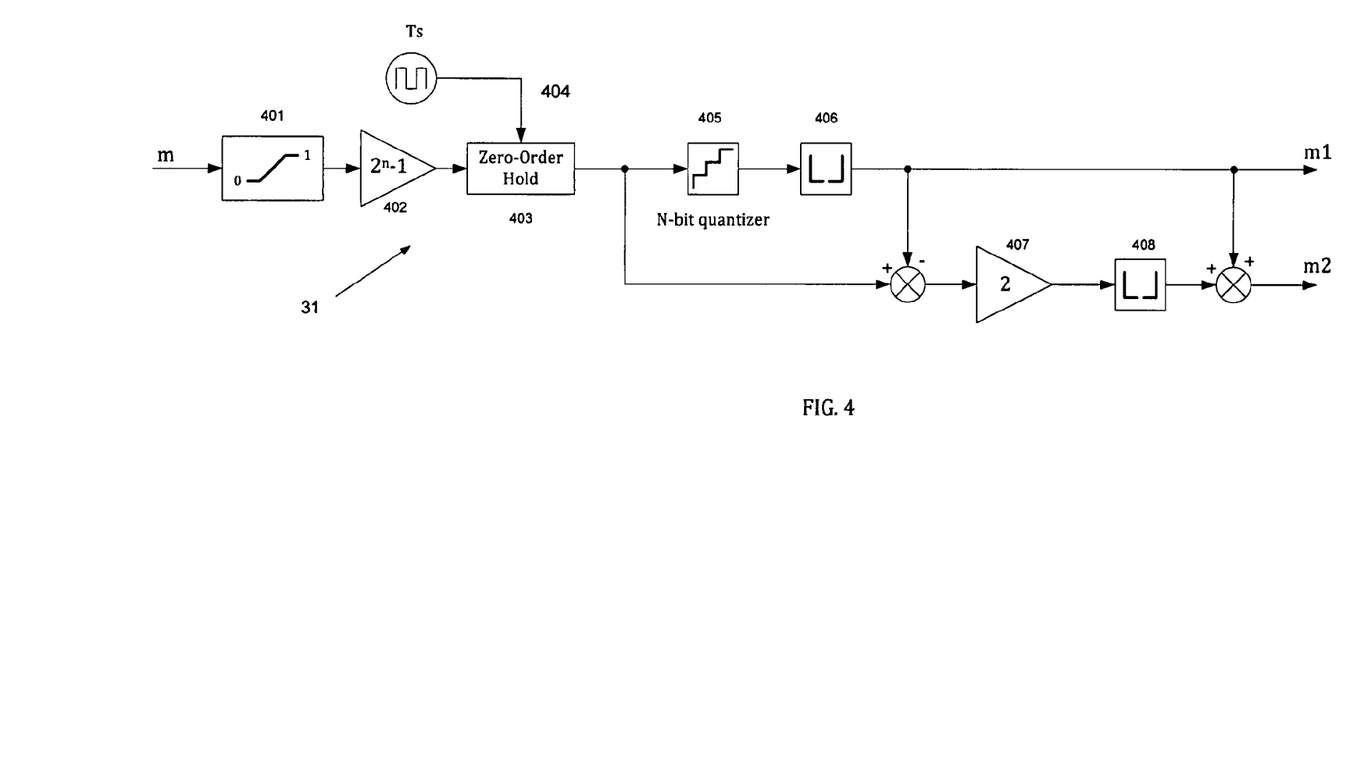
FIG. 4 is a block diagram representation of the circuit according to the present invention.

FIG. 4 shows circuit 31, which is the object of the invention. The input m of circuit 31 is taken from the output of the proportional-integrative-derivative (PID) block 32 shown in FIG. 3, with a resolution of at least one bit higher relative to the standard DPWM generator. The aforementioned value m is then saturated between the values 0 and 1 by block 401 (this operation can also be performed by the PID block 401). The output of block 401 is applied to a gain block (402) which multiplies it by $N=2^n-1$ and generates another digital value; note that N is the total number of levels of the DPWM block 33 used in combination with circuit 31. This operation is normally used in standard digital PWM circuits to obtain an integer value to be used in the standard digital counter included in the device used.

The input of block 403 is then sampled in time at a predetermined frequency fs=1/Ts; this value of the period must coincide and be synchronized with the aforementioned period of the DPWM (404). The sampling in time, for example, can be performed by a zero-order module, where the preceding value sampled is kept constant until the next value sampled. Block 405 is an n-bit quantizer. Block 406, connected to block 405, performs a rounding-down (or truncating) operation on its value of the digital input. The output of block 406 is the coefficient of modulation m1, which is directly connected to the DPWM having a resolution of N-bit; m1 is an integer value in the range [0, N−1]. This value of m1, or duty cycle, is used for driving only one leg of the universal bridge circuit. The fractional part that cannot be represented by m1 because of the limited resolution is obtained by difference between the outputs of block 404 and block 406; this value, supplied to block 407, is always a positive number and has the same resolution as the input m. The combination of blocks 407 and 408 performs rounding of the aforementioned value to the nearest integer value (0 or 1). Block 408 itself performs a rounding-down operation, such that its output is the minimum integer value that is not greater than the input. The coefficient of modulation m2 is calculated as the sum of m1 and the result of the aforementioned rounding operation and is then applied to the digital block PWM 33 for driving the other leg of the full-bridge (or H bridge) 34.

The two outputs m1 and m2 are applied to a digital generator of amplitude-pulsation waveforms 33 composed of two independent driver circuits of the half-bridge type. The circuit of the invention 31, together with block 33, permits generation of two different values of duty cycle, inserting a new level of quantization, while maintaining the same time interval of the pulse width defined by the LSB of the DPWM N-bit generator. With a predefined switching period Ts, the circuit of the invention leads to certain situations where the duty cycle m1 and the duty cycle m2 differ by just one LSB, as shown in FIG. 5.

Figure 5:
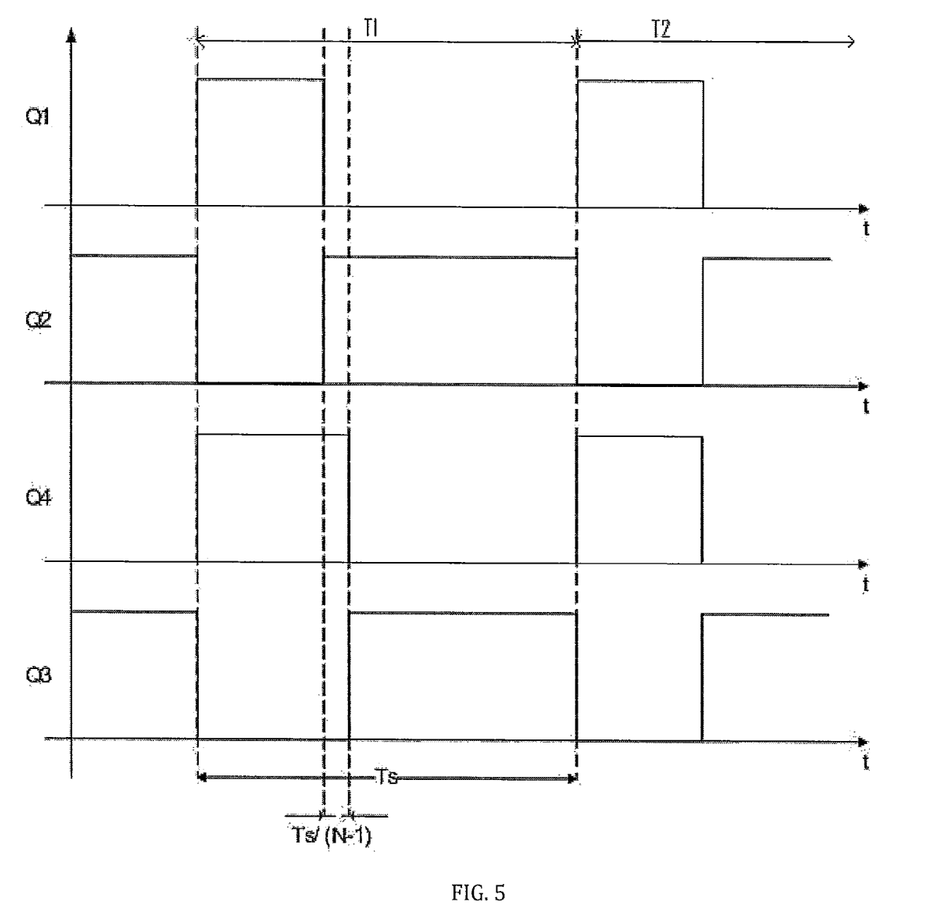
FIG. 5 illustrates some typical waveforms obtained from the circuit according to the present invention.

FIG. 5 shows some typical waveforms at the input of transistors Q1 and Q4 on two switching periods T1 and T2: in the first period T1, the amplitude of the pulse in Q4 is Ts/(N−1) larger than in Q1, while in the second period T2, the coefficients of modulation are equal. The value of the coefficient of modulation m, in FIG. 5, obviously has changed from the time interval T1 to the time interval T2.

The average voltage levels at the terminals of the low-pass filter are $N=2^n$ with a standard PWM generator, but they rise to $2N+1=2^{n+1}+1$ in combination with the circuit of the invention.

The average values of the output voltage at the output terminals of the power supply can be calculated as VOUT=VIN·(m1+m2−1).

In one embodiment, the basic scheme for a digitally controlled power supply, using the circuit according to the invention, can be combined with the well-known "dithering" technique; this permits reduction of the residual waviness by the output components at the switching frequency, at the same time maintaining the same equivalent output resolution.

Figure 6:
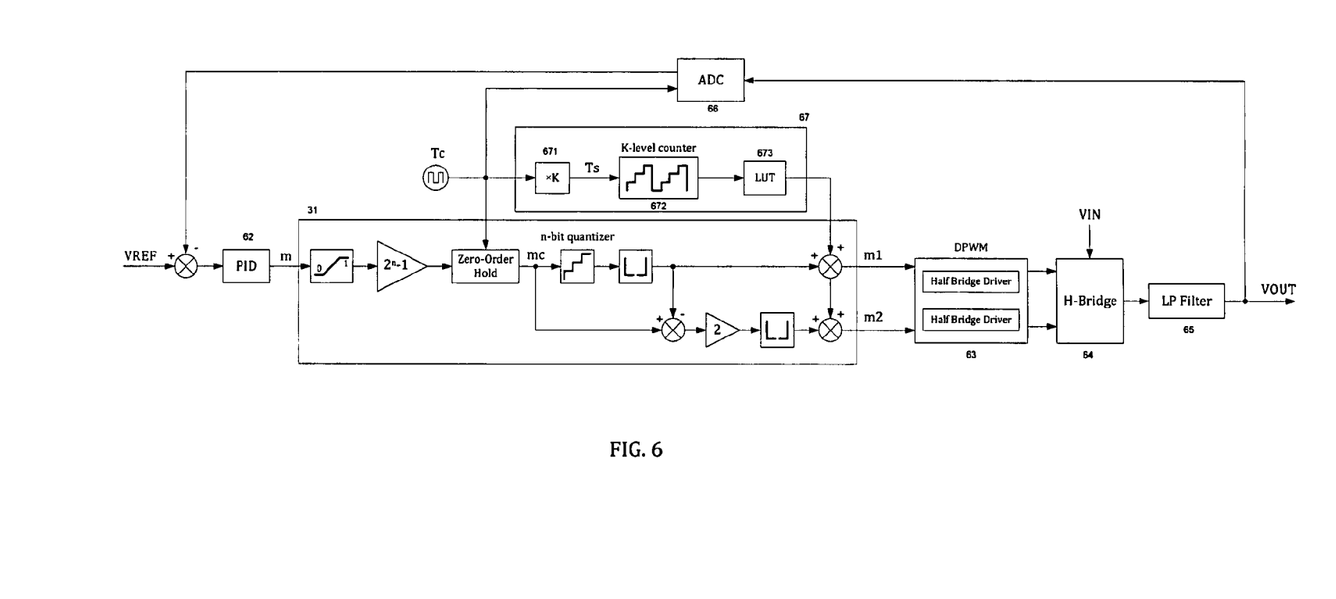
FIG. 6 is a functional block diagram of a power supply of the switching type containing the circuit according to the invention combined with a modulation scheme that uses the "dithering" technique.

FIG. 6 shows a closed reaction system with dithering ratio equal to K.

In this voltage-controlled power supply, the digital error signal between the input voltage ("set" point) VREF and its measured value VOUT is applied to the proportional-integral-derivative (PID) block (or to a block that performs a different compensation algorithm) which generates the coefficient of modulation m. This value, after being sampled with a period Tc and applied to circuit 31 as shown in FIG. 4, generates two different coefficients of modulation m1 and m2.

These coefficients are used for generating two different square-wave signals in the DPWM block 63, which generates square-wave signals from values quantized at N-levels of the index of modulation (i.e. m1 and m2). The H bridge stage (64) is directly driven by two different half-bridge driver circuits (or by a single full-bridge driver circuit).

The output of the H bridge 64 is then filtered by a low-pass circuit 65 and the output voltage VOUT is then detected by the analogue-digital converter (ADC) 46 with the aforementioned period Tc.

Addition of the subsystem of the dithering type 67 makes it possible to obtain a low waviness (ripple) of the output voltage, at the same time maintaining the same output resolution (on a period Tc).

This subsystem 67 consists of a clock multiplier (by a factor K) 671 that controls a counter with K-levels 672 which indexes to a look-up table (LUT) 673 containing the binary dithering patterns with a time period Ts=K·Tc (switching frequency). These patterns are added to the indices of modulation m1 and m2 and then applied to the aforementioned double-channel pulse generator in the DPWM block 63.

The average values of the output voltage attainable with this technique coincide exactly with those obtainable without the use of the dithering functionality, i.e. the same resolution, but the waviness (ripple) of the output voltage, maintaining the same output of the low-pass filter, is decreased owing to the increase in switching frequency Ts.

This control scheme is suitable for controlling other types of variables such as output current, motor speed, etc.

Figure 7:
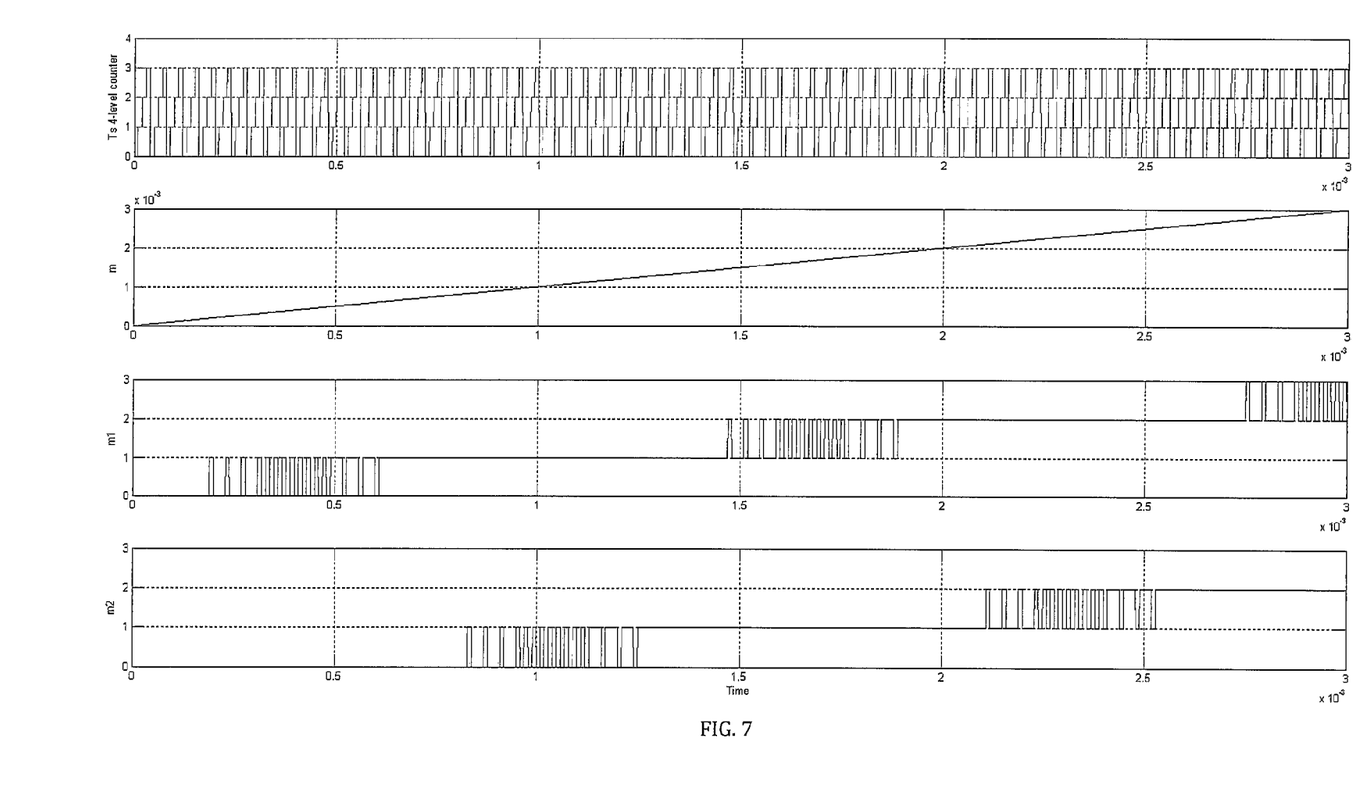
FIG. 7 is a behavioural representation of the indices of modulation as a function of a control variable when the "dithering" technique is applied.

The behaviour of the indices of modulation m1 and m2, with a dithering ratio at K-levels (K=4) as a function of m and with a quantizer that has a resolution of n=8, is shown in FIG. 7.

Figure 8:
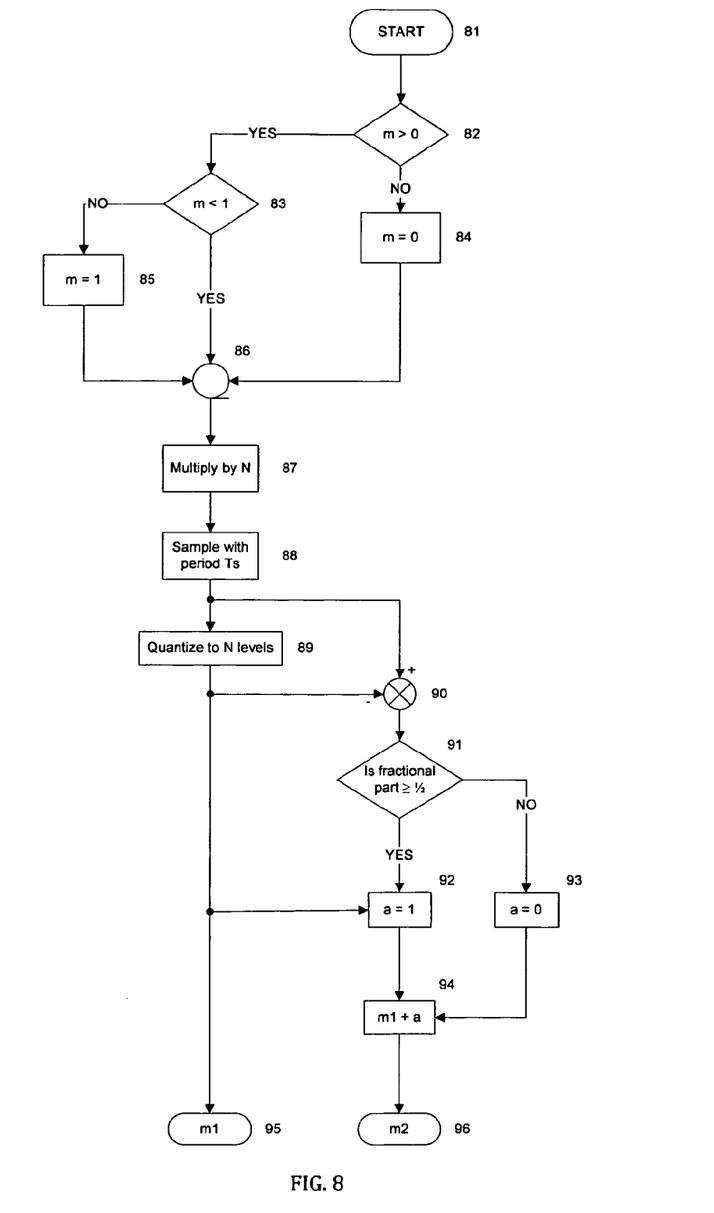
FIG. 8 shows a flow chart of a method for generating the coefficients of modulation from the circuit according to the present invention.

FIG. 8 shows a flow chart of the method used for generating the coefficient of modulation m1 and m2. It will be apparent, to a person skilled in the art, how the method according to blocks 81-88 is to be implemented in the light of blocks 401, 402 and 403. The method block 89 performs a quantization at n-bit according to circuit 405 and a truncation according to block 406. The combination of blocks 92 and 93 performs a rounding operation of the fractional part 91 to the nearest integer value ("0" or "1"); the rounding operation is performed at circuit level by the combination of block 407, which multiplies the fractional part by 2, and of block 408, which truncates the result of the multiplication. Block 94 performs an addition according to the addition module of the circuit in FIG. 4.

Other details of implementation will not be described, since a person skilled in the art can carry out the invention on the basis of the teaching of the above description.

Many changes, modifications, variations and other uses and applications of the subject matter of the invention will be clear to a person skilled in the art after considering the specific features and the accompanying drawings, which disclose the best examples of implementation of the invention. All such changes, modifications, variations and other uses and applications of the subject matter that remain within the scope of the invention, are covered by this invention.

The invention claimed is:

1. Method for driving a full-bridge circuit comprising a circuit receiving an input modulation signal (m) and generating a first output modulation signal and a second output modulation signal for controlling the full-bridge, the method comprises the steps of:
generating a first and second square wave having a common square wave period, where the first square wave is configured to drive one leg of the full-bridge and the second square wave is configured to drive the second leg of the full-bridge,
wherein:
the first square wave is generated with a first duty cycle based on the first modulation signal, where the first modulation signal is an N-levels truncate version of the input control signal; the second square wave is generated with a second duty cycle equal to or larger than the first duty cycle by an incremental time step Ts/(N−1) based on the second modulation signal, where the second modulation signal is obtained firstly by doing a difference between the input modulation signal and the N-levels truncated version, secondly by doing a rounding operation of said difference.

2. Method according to claim 1, wherein the input modulation signal is generated by a digital proportional-integrative-derivative, short PID, module.

3. Method according to claim 1, wherein the input modulation signal is saturated to a high predetermined value when the input modulation signal is greater than a threshold value, saturated to a low predetermined value when the input modulation signal is lower than a threshold value.

4. Method according to claim 1, wherein the circuit is combined with a dithering module having a dithering ratio K such to generate dithering patterns having a square period Ts=Tc·K, where Tc is a sampling period of the input modulation signal, wherein the dithering patterns are added to the first modulation signal and to the second modulation signal.

5. Method according to claim 1, wherein the output current/voltage in the load of the full bridge is feed forwarded to the input modulation signal.

6. Method according to claim 1, wherein the input modulation signal is sampled with a sampling period equal to common square wave period.

7. Circuit for driving a full-bridge circuit comprising an input modulation signal and comprising a first output modulation signal and a second output modulation signal for controlling the full-bridge, where the circuit is able to generate a first and second square wave having a common square wave period, where the first square wave is configured to drive one leg of the full-bridge and the second square wave is configured to drive the second leg of the full-bridge,
wherein the circuit further comprises:
means for generating the first square wave with a first duty cycle based on the first modulation signal, where the first modulation signal is an N-levels truncate version of the input control signal;
means for generating the second square wave with a second duty cycle equal to or larger than the first duty cycle by an incremental time step Ts/(N−1) based on the second modulation signal, where the second modulation signal is obtained firstly by doing a difference between the input modulation signal and the N-levels truncated version, secondly by doing a rounding operation of said difference.

8. Circuit according to claim 7 further comprising a digital pulse width modulator, short DPWM, able to generate the first square wave and second square wave and to receive as inputs the first modulation signal and second modulation signal.

9. Circuit according to claim 7 further comprising a digital proportional-integrative-derivative, short PID, module able to generate the input modulation signal.

10. Circuit according to claim 7, wherein the circuit further comprises a block able to saturate the input modulation signal to a high predetermined value when the input modulation signal is greater than a first threshold value, and able to saturate the input modulation signal to a low predetermined value when the input modulation signal is lower than a second threshold value.

11. Circuit according to claim 7, wherein the circuit further comprises a dithering module having a dithering ratio K such to generate dithering patterns having a square period Ts=Tc·K, where Tc is a sampling period of the input modulation signal, and such that the dithering patterns are added to the first modulation signal and to the second modulation signal.

12. Circuit according to claim 7, wherein the output current/voltage in the load of the full bridge is feed-forwarded connected to the input modulation signal.

13. Circuit according to claim 7, further including a sampling circuit for time sampling the input modulation signal with a sampling period equal to common square wave period.

14. Circuit according to claim 13, wherein the sampling circuit is a zero-order hold module.

* * * * *